(12) United States Patent
Tang et al.

(10) Patent No.: US 9,173,283 B2
(45) Date of Patent: Oct. 27, 2015

(54) PRINTED CIRCUIT BOARD

(71) Applicant: ShenZhen Goldsun Network Intelligence Technology Co., Ltd., ShenZhen (CN)

(72) Inventors: Shao-You Tang, New Taipei (TW); Po-Chuan Hsieh, New Taipei (TW)

(73) Assignee: ShenZhen Goldsun Network Intelligence Technology Co., Ltd., ShenZhen (CN)

(*) Notice: Subject to any disclaimer, the term of this patent is extended or adjusted under 35 U.S.C. 154(b) by 54 days.

(21) Appl. No.: 14/132,118

(22) Filed: Dec. 18, 2013

(65) Prior Publication Data
US 2014/0182893 A1 Jul. 3, 2014

(30) Foreign Application Priority Data
Dec. 28, 2012 (TW) .............................. 101150864 A

(51) Int. Cl.
H05K 1/02 (2006.01)
H05K 1/16 (2006.01)

(52) U.S. Cl.
CPC ............ *H05K 1/0225* (2013.01); *H05K 1/0222* (2013.01); *H05K 1/0245* (2013.01); *H05K 1/0253* (2013.01); *H05K 1/16* (2013.01); *H05K 2201/09254* (2013.01); *H05K 2201/09618* (2013.01); *H05K 2201/09627* (2013.01)

(58) Field of Classification Search
CPC ............................... H05K 1/0298; H05K 1/02

USPC .................................................. 174/251, 255
See application file for complete search history.

(56) References Cited

U.S. PATENT DOCUMENTS

| 7,459,985 | B2 * | 12/2008 | Mellitz et al. ..................... 333/5 |
| 2003/0177634 | A1 * | 9/2003 | Morris ............................. 29/829 |
| 2006/0091545 | A1 * | 5/2006 | Casher et al. ................. 257/738 |
| 2009/0124103 | A1 * | 5/2009 | Fogg et al. ..................... 439/108 |
| 2009/0149041 | A1 * | 6/2009 | Morlion et al. .................. 439/65 |
| 2009/0229859 | A1 * | 9/2009 | Oprea et al. .................. 174/250 |
| 2012/0233857 | A1 * | 9/2012 | Kashiwakura .................. 29/829 |
| 2014/0209369 | A1 * | 7/2014 | Tang et al. .................... 174/262 |

* cited by examiner

*Primary Examiner* — Timothy Thompson
*Assistant Examiner* — Charles Pizzuto
(74) *Attorney, Agent, or Firm* — Novak Druce Connolly Bove + Quigg LLP

(57) ABSTRACT

A printed circuit board (PCB) includes a ground layer, a first layer, a second layer, a connector footprint, and a pair of differential signal lines. The connector footprint comprises first and second bonding pads. The PCB defines a first signal via in a central portion of a space bounded by the first bonding pad, and a second signal via in a central portion of a space bounded by the second bonding pad. A number of first ground vias on the first bonding pad and a number of second ground vias on the second bonding pad are electrically connected to the ground layer. First annular slots surrounding corresponding first ground via are defined in the ground layer. Second annular slots surrounding corresponding second ground vias are defined in the ground layer. Connection slots are defined in the ground layer and communicate between the first annular slots and the second annular slots.

5 Claims, 3 Drawing Sheets

PRINTED CIRCUIT BOARD

BACKGROUND

1. Technical Field

The present disclosure relates to a printed circuit board.

2. Description of Related Art

Differential mode signals have a higher tolerance than common mode signals. Because of structural requirements of footprints of connectors, differential mode signal lines require a single-ended signal line, which may cause noise.

Therefore, there is room for improvement in the art.

BRIEF DESCRIPTION OF THE DRAWINGS

Many aspects of the present disclosure can be better understood with reference to the following drawing(s). The components in the drawing(s) are not necessarily drawn to scale, the emphasis instead being placed upon clearly illustrating the principles of the present disclosure. Moreover, in the drawing(s), like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one." The reference "a plurality of" means "at least two."

Figure 1:
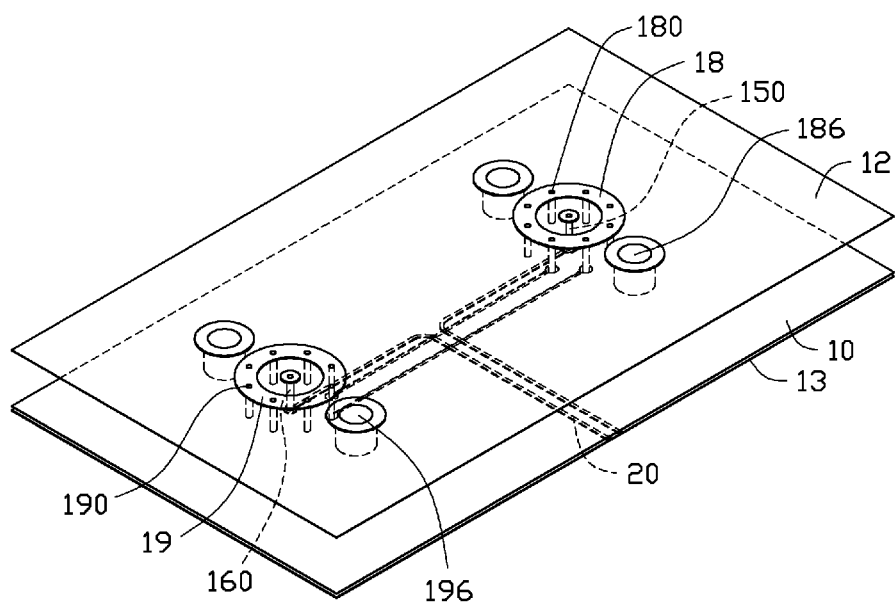
FIG. 1 is an isometric view of an embodiment of a printed circuit board.
Figure 2:
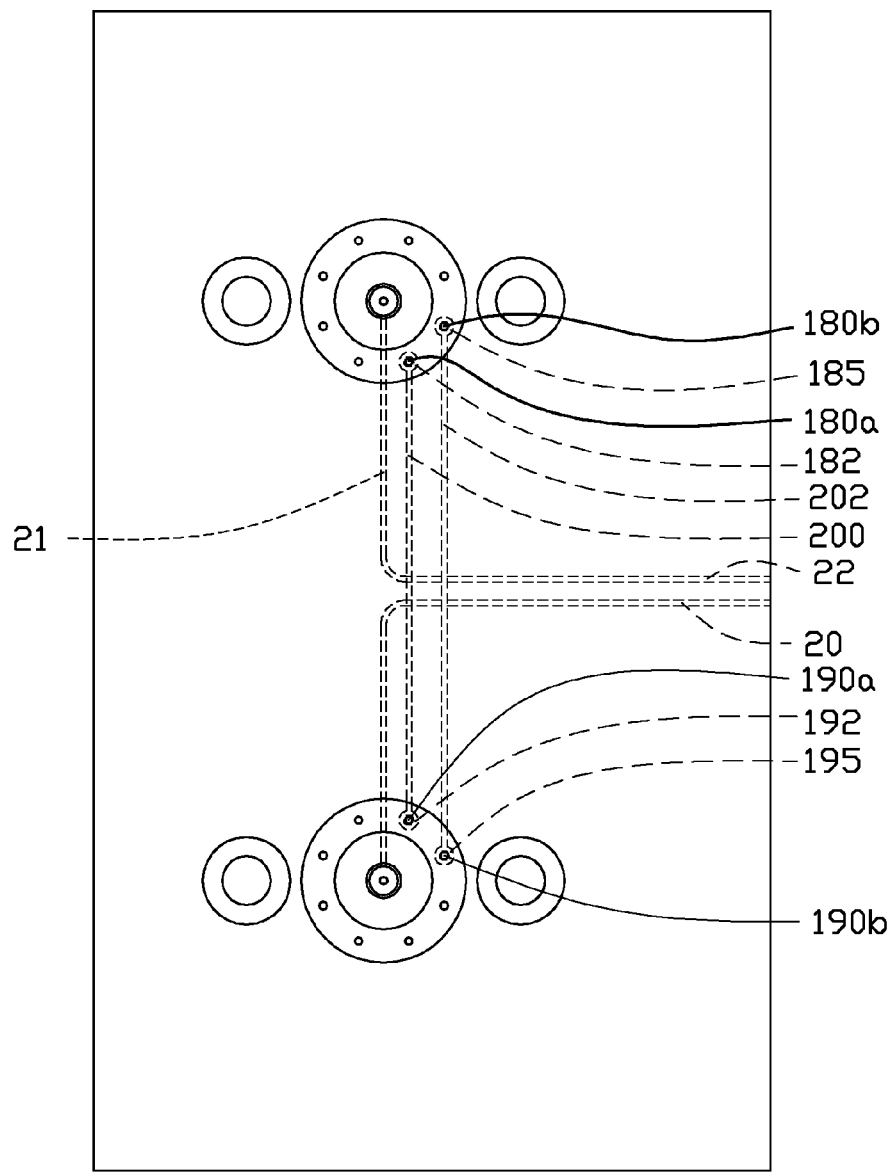
FIG. 2 is a top plan view of the printed circuit board of FIG. 1.

FIG. 1 and FIG. 2 show an embodiment of a printed circuit board.

The printed circuit board includes a ground layer 10, a first layer 12 above the ground layer 10, a second layer 13 below the ground layer 10, a connector footprint, and a pair of differential signal lines 20.

The connector footprint includes an annular first bonding pad 18 soldered onto the first layer 12, an annular second bonding pad 19 also soldered onto the first layer 12, a plurality of first ground vias 180, a plurality of second ground vias 190, a first signal via 150, and a second signal via 160.

The first ground vias 180 extend through the first bonding pad 18, the first layer 12, the ground layer 10, and the second layer 13, and are electrically connected to the ground layer 10 and the first bonding pad 18. The second ground vias 190 extend through the second bonding pad 19, the first layer 12, the ground layer 10, and the second layer 13, and are electrically connected to the ground layer 10 and the second bonding pad 19.

In one embodiment, there are eight first ground vias 180, and the eight first ground vias 180 are arranged substantially equidistantly around the first bonding pad 18. There are also eight second ground vias 190, and the eight second ground vias 190 are also arranged substantially equally around the second bonding pad 19.

Two third ground vias 186 are defined through the first layer 12, the ground layer 10, and the second layer 13 at two opposite sides of the first bonding pad 18, respectively. The third ground vias 186 and the first bonding pad 18 are arranged in a line substantially perpendicular to a line between the first and second bonding pads 18 and 19. Two fourth ground vias 196 are defined through the first layer 12, the ground layer 10, and the second layer 13 at two opposite sides of the second bonding pad 19, respectively. The fourth ground vias 196 and the second bonding pad 19 are arranged in a line substantially parallel to the line of the third ground vias 186 and the first bonding pad 18. In one embodiment, the third ground vias 186 and the fourth ground vias 196 are all electrically connected to the ground layer 10.

The first signal via 150 extends through the first layer 12, the ground layer 10, and the second layer 13, and is located in a central location bounded by the first bonding pad 18. The second signal via 160 extends through the first layer 12, the ground layer 10, and the second layer 13, and is located in a central location bounded by the second bonding pad 19. When a connector (not shown) is set on the printed circuit board, two pins of the connector are electrically connected to the second layer 13 through the first and second signal vias 150 and 160, respectively. In one embodiment, each of the two differential mode signal lines 20 is substantially L-shaped and comprises a first part 21 and a second part 22, both of which are arranged on the second layer 13. The first parts 21 of the two differential mode signal lines 20 extend toward each other from the first and second signal vias 150 and 160, respectively. Distal ends of the first parts 21 opposite from the corresponding first and second signal vias 150 and 160 are spaced from each other. The second parts 22 of the two differential mode signal lines 20 extend from the distal ends of the corresponding first parts 21, such that the second parts 22 are substantially parallel to each other.

The ground layer 10 defines a first annular slot 182 and a second annular slot 185. The first annular slot 182 surrounds a first via 180a of the first ground vias 180 most adjacent to a front side of the corresponding first part 21 of the differential mode signal line 20. The second annular slot 185 surrounds the second via 180b of the first ground vias 180 most adjacent to a front side of the first via 180a. Thus, the first via 180a and the second via 180b are partitioned from the rest of the ground layer 10. The ground layer 10 further defines a third annular slot 192 and a fourth annular slot 195. The third annular slot 192 surrounds a third via 190a of the second ground vias 190 most adjacent to a front side of the corresponding first part 21 of the differential mode signal line 20. The fourth annular slot 195 surrounds a fourth via 190b of the second ground vias 190 most adjacent to a front side of the third via 190a. Thus, the third via 190a and the fourth via 190b are partitioned from the rest of the ground layer 10. The first slot 182 is located between the second slot 185 and the corresponding first part 21 connected to the first signal via 150. The third slot 192 is located between the fourth slot 195 and the corresponding first part 21 connected to the second signal via 160. A substantially straight first connection slot 200 is defined in the ground layer 10. The first connection slot 200 communicates between the first slot 182 and the third slot 192. A substantially straight second connection slot 202 is defined in the ground layer 10. The second connection slot 200 communicates between the second slot 185 and the fourth slot 195. The first and second connection slots 200 and 202 are substantially parallel to each other, and orthographic projections of the first and second connection slots 200 and 202 on the second layer 13 are substantially perpendicular to and intersect with the second parts 22 of the differential mode signal lines 20.

Side surfaces of the first to fourth slots 182, 185, 192, and 195, and of the first and second connection slots 200 and 202 of the ground layer 10 help accumulate charges, thereby forming capacitors. Return paths of common mode noise are generated on the ground layer 10 and surround the first to fourth slots 182, 185, 192, and 195, and the first and second connection slots 200 and 202. Transmission of currents of the common mode noise is along the first to fourth slots 182, 185, 192, and 195, and the first and second connection slots 200 and 202, thereby forming inductors. The capacitors and the inductors are in parallel. Therefore, common noises of a particular frequency band on the ground layer 10 can be obstructed.

Figure 3:
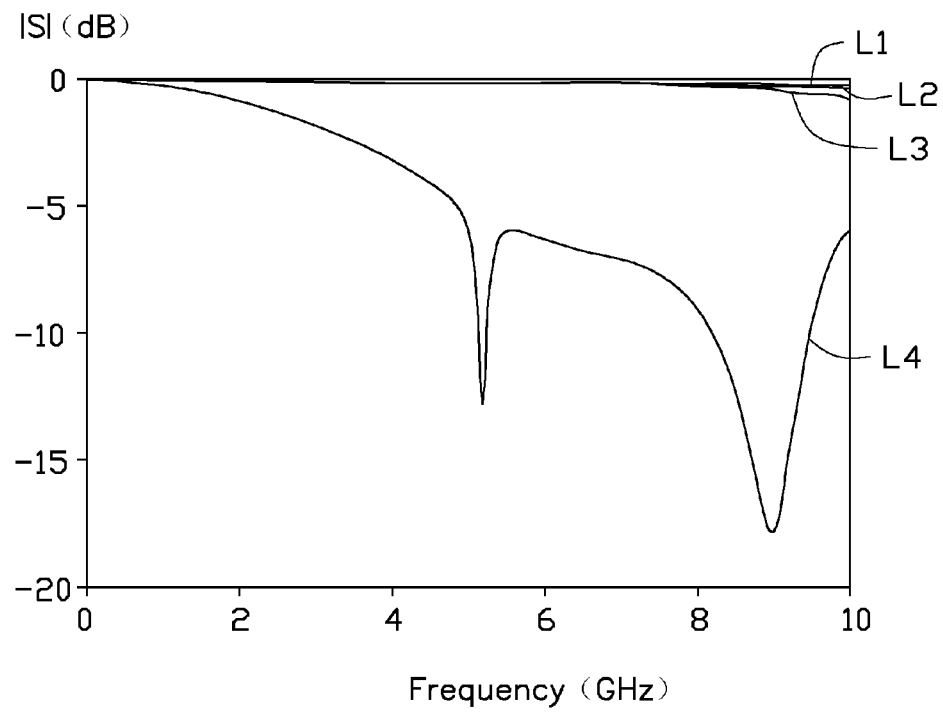
FIG. 3 is a diagram of frequency domain waveforms of signals transmitted in conventional printed circuit boards and in the printed circuit board of FIG. 1.

Referring to FIG. 3, a curve L1 represents a frequency domain waveform of a differential mode signal transmitted without the first through fourth slots 182, 185, 192, and 195, and without the first and second connection slots 200 and 202. A curve L2 represents a frequency domain waveform of a common mode signal transmitted without the first through fourth slots 182, 185, 192, and 195, and without the first and second connection slots 200 and 202. A curve L3 represents a frequency domain waveform of the differential mode signal transmitted with the first through fourth slots 182, 185, 192, and 195, and with the first and second connection slots 200 and 202. A curve L4 represents a frequency domain waveform of the common mode signal transmitted with the first to fourth slots 182, 185, 192, and 195, and with the first and second connection slots 200 and 202. The greater the numerical of the vertical axis is, the lower the attenuation of the signal amplitude is.

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A printed circuit board (PCB), comprising a ground layer, a first layer above the ground layer, a second layer below the ground layer, two differential mode signal lines, and a connector footprint comprising a first bonding pad arranged on the first layer, a second bonding pad arranged on the first layer, a first signal via defined in a central location bounded by the first bonding pad and extending through the first layer, the ground layer, and the second layer, a second via is defined in a central location bounded by the second bonding pad and extending through the first layer, the ground layer, and the second layer, a plurality of first ground vias extend through the first bonding pad, the first layer, the ground layer, and the second layer, and a plurality of second ground vias extend through the second bonding pad, the first layer, the ground layer, and the second layer, wherein the plurality of first and second ground vias is electrically connect to the ground layer, the two differential mode signal lines each comprises a first part extending from a corresponding one of the first and second signal vias toward the other one of the first and second signal vias, and a second part substantially perpendicularly extending from a distal end of the first part opposite to the corresponding one of the first and second signal vias, the first and second parts are both arranged on the second layer, the distal ends of the first parts are apart from each other, the ground layer defines a first slot surrounding one of the plurality of first ground vias located adjacent to the first part and at a side bounded by the first and second parts of a corresponding one of the two differential mode signal lines, a second slot surrounding one of the plurality of second ground vias located adjacent to the first part and at a side bounded by the first and second parts of the other one of the two differential mode signal lines, and a first connection slot communicating between the first slot and the second slot, a projection of the first connection slot on the second layer is substantially perpendicularly to the second parts of the two differential mode signal lines.

2. The PCB of claim 1, wherein the first and second bonding pads are annular.

3. The PCB of claim 1, wherein the ground layer further defines a third slot surrounding another first ground via located adjacent to the first slot and at the side bounded by the first and second parts of the corresponding one of the two differential mode signal lines, a fourth slot surrounding another second ground via located adjacent to the second slot and at the side bounded by the first and second parts of the other one of the two differential mode signal lines, and a second connection slot communicating between the third slot and the fourth slot; a projection of the second connection slot on the second layer is substantially perpendicular to the second parts of the two differential mode signal lines.

4. The PCB of claim 1, further comprising two third ground vias extending through the first layer, the ground layer, and the second layer, wherein the third ground vias are located at two opposite sides of the first bonding pad, the third ground vias and the first bonding pad are arranged in a line substantially perpendicular to the first parts of the two differential mode signal lines, and the third ground vias are electrically connected to the ground layer.

5. The PCB of claim 1, further comprising two fourth ground vias extending through the first layer, the ground layer, and the second layer, wherein the fourth ground vias are located at two opposite sides of the second bonding pad, the fourth ground vias and the second bonding pad are arranged in a line substantially perpendicular to the first parts of the two differential mode signal lines, and the fourth ground vias are electrically connected to the ground layer.

* * * * *